United States Patent
Hilt et al.

(10) Patent No.: US 11,679,974 B2
(45) Date of Patent: Jun. 20, 2023

(54) MECHANICAL MICROSYSTEM AND ASSOCIATED MANUFACTURING METHOD

(71) Applicant: COMMISSARIAT A L'ENERGIE ATOMIQUE ET AUX ENERGIES ALTERNATIVES, Paris (FR)

(72) Inventors: Thierry Hilt, Grenoble (FR); Christel Dieppedale, Grenoble (FR); Laurent Mollard, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 64 days.

(21) Appl. No.: 17/104,421

(22) Filed: Nov. 25, 2020

(65) Prior Publication Data

US 2021/0163279 A1    Jun. 3, 2021

(30) Foreign Application Priority Data

Nov. 28, 2019    (FR) ..................................... 19 13425

(51) Int. Cl.
*B81B 3/00*    (2006.01)
*B81C 1/00*    (2006.01)

(52) U.S. Cl.
CPC ........ *B81B 3/0037* (2013.01); *B81C 1/00182* (2013.01); *B81B 2203/0118* (2013.01); *B81B 2203/0154* (2013.01); *B81C 2201/0132* (2013.01)

(58) Field of Classification Search
CPC . B81B 5/00; B81B 3/0037; B81B 2203/0118; B81B 2203/0154; B81B 7/02; B81B 3/0021; B81C 1/00182; B81C 2201/0132; B81C 1/0015; H01L 41/22;
(Continued)

(56) References Cited

U.S. PATENT DOCUMENTS 5,049,775 A    9/1991    Smits
9,612,434 B2 *  4/2017   Yasuda ................. H01L 41/083
(Continued)

OTHER PUBLICATIONS

French Preliminary Search Report dated Jun. 5, 2020 in French Application 19 13425 filed on Nov. 28, 2019 (with English Translation of Categories of Cited Documents & Written Opinion), 8 pages.

*Primary Examiner* — Shahed Ahmed
*Assistant Examiner* — Sun Mi Kim King
(74) *Attorney, Agent, or Firm* — Oblon, McClelland, Maier & Neustadt, L.L.P.

(57) ABSTRACT

A mechanical microsystem including a pair of elastically deformable elements, a mechanical hinge joining the deformable elements together, and at least two electroactive layers. The microsystem is configured such that, from a rest position wherein the deformable elements fall into a plane, a deformation of one of the deformable elements displacing it outside of the plane induces an electric current circulation in one of the two electroactive layers, and/or conversely. Each deformable element has a front face and a rear face opposite one another and substantially parallel to the plane. A first electroactive layer is arranged together with a first deformable element on its rear face, and a second electroactive layer, different from the first layer, is arranged with a second deformable element, different from the first element, on its front face.

8 Claims, 3 Drawing Sheets

(58) Field of Classification Search
CPC .. H01L 41/0946; H01L 41/094; H01L 41/332
See application file for complete search history.

(56) References Cited

U.S. PATENT DOCUMENTS

2005/0073219 A1 4/2005 Johansson
2013/0140156 A1 6/2013 Fujii et al.

* cited by examiner

MECHANICAL MICROSYSTEM AND ASSOCIATED MANUFACTURING METHOD

TECHNICAL FIELD

The present invention relates to the field of mechanical microsystems. Such systems can be defined as objects, of which at least one characteristic dimension is micrometric and which are capable of locally deforming. They are configured to carry out a sensor function, i.e. to transform a physical quantity, such as a force and/or a deformation, in electric signal, and/or, conversely, to carry out an actuator function, i.e. to transform an electric signal into a physical quantity, such as a force and/or a deformation. The type of mechanical microsystems in question comprises more specifically:

a. at least one so-called electroactive portion converting a force and/or a deformation into electric signal, and conversely, and b. at least one so-called passive portion on which the exertion of a force and/or a deformation is converted into electric signal or is controlled by application of an electric voltage on the electroactive portion.

These conversions can be made thanks to physical phenomena such as expansion, electrostriction, the piezoelectric effect, the state or phase change, the thermoelectric effect, the pyroelectric effect, etc.

The present invention has a particularly advantageous application in its integration in electromechanical microsystems (or MEMS), nanometric electromechanical systems (or NEMS), transducers, sensors, actuators, micromembranes, microbeams, micromotors, etc.

STATE OF THE ART

Currently, the embodiment of microbeams or micromembranes known consists of depositing an electroactive material on a flexible layer with the basis of a passive material.

More specifically, mechanical microsystems are known, comprising:

a. At least two flexible beams made of a so-called passive material, such as silicon, b. A mechanical hinge joining said at least two beams together, and c. At least two so-called electroactive layers, each with the basis of a so-called electroactive material, for example a piezoelectric material, at least one electroactive layer being arranged on each of said at least two beams.

When such mechanical microsystems are used as actuators, the application of an electric voltage between terminals of one of the electroactive layers induces the contraction or the extension, along the direction of the electric polarisation, of the beam on which the electroactive layer is deposited. Thus, a bimetal effect is created.

More specifically, in absence of application of a voltage, such as a mechanical microsystem, has substantially a planar symmetry that it leaves to take a curved symmetry when an electric voltage is applied. Indeed, each beam at the level of which an electric voltage is applied undergoes a displacement driving it outside of the so-called rest plane, wherein the mechanical microsystem falls into absence of application of a voltage.

It is moreover known that the lead zirconate titanate (PZT)-based piezoelectric layers have an interest in terms of quality and electric-mechanical conversion yield factors. However, the ferroelectric electroactive layers are only contracted, whatever the direction of polarisation of the electric field which is applied to it. In this case, each beam on which an electric voltage applied is always displaced towards one same semi-space defined by the rest plane.

Such that the displacement outside of the plane of the beams can be generated in the two directions, it is possible to deposit, on one same substrate, two PZT-based layers superposed together and separated by a Pt/Ti electrode layer (see in particular, "2D scanning mirror using bi-layer PZT films", by J. Tsaur, et al., AIST, Tsukuba, Japan, 2D Micro Scanner Actuated by sol-gel derived double layered PZT, MEMS 2002). In this way, by applying an electric voltage only on a first of the two PZT layers, a displacement of the beams is obtained opposite to that obtained by applying an electric voltage only the second of the two PZT layers. Thus, the beams are specific to being displaced in the two semi-spaces defined by the plane, wherein the mechanical microsystem substantially falls, in absence of application of an electric voltage. Furthermore, the method for forming such a mechanical microsystem can comprise the local etching of the substrate over the whole of its thickness, such that the neutral fibre of such a mechanical microsystem thus passes advantageously between the two PZT-based layers.

It is however very laborious, in the current state of the art, to achieve a double series of PZT deposition.

An aim of the present invention is therefore to propose a mechanical microsystem having at least the same advantages, and having in particular deformable elements, capable of being moved in at least two directions, which is easier to manufacture and/or less expensive.

The other aims, features and advantages of the present invention will appear upon examining the following description and the supporting drawings. It is understood that other advantages can be incorporated.

SUMMARY

To achieve this aim, the invention relates to, according to a first aspect, a microsystem comprising:

a. a pair of elastically deformable elements, b. a mechanical hinge joining the deformable elements together, and c. at least two electroactive layers, the mechanical microsystem being configured such that, from a rest position, wherein the deformable elements fall substantially into one same so-called rest plane, a deformation of at least one of the deformable elements displacing it at least partially outside of the rest plane induces an electric current circulation in at least one of the at least two electroactive layers, and/or conversely, each deformable element having a front face and a rear face, opposite one another, and substantially parallel to the rest plane, the mechanical microsystem being mainly such as a first of the at least two electroactive layers is arranged together with a first deformable element of the pair on a rear face of this first deformable element, and in that a second electroactive layer, different from the first layer, of the at least electroactive layers is arranged with a second deformable element of the pair, different from the first element, on a front face of this second deformable element.

The front/rear faces of the deformable elements have between them, one same orientation opposite the orientation of the rear/front faces of the deformable elements.

The invention according to its first aspect, thus proposes a mechanical microsystem capable of generating movements of the deformable elements, outside of the rest plane, which are antagonistic by the production of a bimetal effect.

Thanks to these antagonistic movements of the deformable elements, it is allowed to generate an angle between two deformable elements of one same pair, i.e. at the level of an intermediate portion, called mechanical hinge or "ball", of the device, which is doubled with respect to a mechanical microsystems with non-antagonistic movements and/or obtaining displacements of the deformable elements of one same pair, of an amplitude substantially equal to that offered by a mechanical microsystem with non-antagonistic movements, but by achieving electric energy savings and/or obtaining an amplitude substantially greater than equivalent actuation tension.

Furthermore, the neutral fibre of the mechanical microsystem according to the first aspect of the invention advantageously passes between each deformable element and the electroactive layer arranged together with this deformable element, thus allowing to maximise the bimetal effect.

A second aspect of the invention relates to a method for manufacturing a mechanical microsystem comprising:
  a. Providing a substrate, with the basis of a first material, on a front face of which at least one first electroactive layer and a second electroactive layer are formed, preferably simultaneously, spaced apart from one another, the substrate further comprising an embedded etching stop layer having an opening just under (or in line with) at least one portion of the first electroactive layer and preferably with no opening just under (or in line with) the second electroactive layer,
  b. Depositing a so-called passive layer, with the basis of a second material, at least just under (or in line with) at least one portion of the first electroactive layer, by leaving at least one portion of the second electroactive layer not covered with said passive layer,
  c. Etching at least one central portion of the substrate on its rear face, to removing said at least one central portion of the substrate over the whole of its thickness situated just under (or in line with) the etching stop layer and to removing said at least one central portion of the substrate over the whole of its thickness to the right of the opening that the etching stop layer has,
  such that the passive layer forms a first elastically deformable element, arranged together with the first electroactive layer,
  such that the etched substrate forms a second elastically deformable element, arranged together with the second electroactive layer, and
  such that at least one from among the etched substrate and the passive layer forms a mechanical hinge joining together the first and second deformable elements.

The method thus allows to manufacture a mechanical microsystem offering the sought easier and/or less expensive function, in particular, as a result of the electroactive layers can be deposited simultaneously.

BRIEF DESCRIPTION OF THE FIGURES

The aims, objectives, as well as the features and advantages of the invention will emerge better from the detailed description of an embodiment of the latter which is illustrated by the following supporting drawings, wherein.

Figure 1:
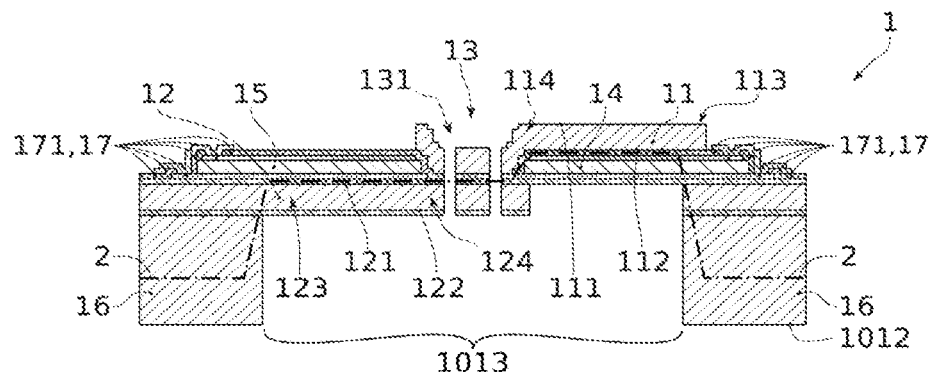
FIG. 1 represents schematically a cross-sectional view of the mechanical microsystem according to an embodiment of the first aspect of the invention.

The drawings are given as examples and are not limiting of the invention. They constitute principle schematic representations intended to facilitate the understanding of the invention and are not necessarily to the scale of practical applications. In particular, the thicknesses such as illustrated of the different layers are not representative of reality.

DETAILED DESCRIPTION

Before starting a detailed review of embodiments of the invention, optional features are stated below which can optionally be used in association or alternatively.

Optionally, the mechanical microsystem according to the first aspect of the invention can further have at least any one of the following features:
  The mechanical hinge can join the deformable elements of each pair together by one of their distal ends;
  The deformable elements of each pair can be situated opposite one another relative to the mechanical hinge;
  Preferably, one single electroactive layer is arranged together with each of the deformable elements;
  The mechanical microsystem can further comprise a rigid frame to which the deformable elements are securely joined by proximal ends, the mechanical hinge joining the deformable elements of the pair together by their distal ends, and the mechanical hinge can be flexible so as to allow a movement of the deformable elements of the pair outside of the rest plane;
  At least one electroactive layer, preferably each electroactive layer, is with the basis of an electroactive material selected from among: a piezoelectric material, a ferromagnetic material and a PTZ-based material. A non-exhaustive list of ferromagnetic materials considered comprises for example, the family of perovskites ABO3, such as PbZrTiO3 (PZT), PbMgNbTiO3 (PMNT), PbMgNbO3-PbTiO3 (PMN-PT), KNaNbO3 (KNN), BaSrTiO3 (BST), BaCaZrTiO3 (BCTZ), BaTiO3 (BT), NaBiTiO3 (NBT), NaBiTiO3-BaTiO3 (NBT-BT), BiFeO3, and ferromagnetic polymers such as polyvinylidene fluoride (or PVDF). Non-ferromagnetic piezoelectric materials are also considered, such as AlN, Sc doped AlN, ZnO. The mechanical microsystem with PZT-based electroactive layers is particularly interesting, since this type of electroactive layer has an interesting quality and conversion yield factor, but, like all ferroelectric materials, can only be contracted under the effect of an electric field, and cannot therefore allow to deform the deformable element which supports it in more than one direction;
  The deformable elements and the mechanical hinge can be based on one same material, for example silicon-based;
  The mechanical microsystem can further comprise at least one intermediate layer situated between the first electroactive layer and the first deformable element and/or on either side of said first electroactive layer and of the first deformable element, and/or situated between the second electroactive layer and the second deformable element and/or on either side of said second electroactive layer and of the second deformable element. Said at least one intermediate layer can be configured to achieve an electric contact point, in particular for applying and/or measuring an electric current circulation in at least one from among the first and the second electroactive layers with which said at least one intermediate layer is arranged together. Complementarily or alternatively to the preceding feature, said at least one intermediate layer can be arranged such that a neutral fibre of the mechanical microsystem is situated between each electroactive layer and the deformable element arranged with this electroactive layer;

The mechanical microsystem can further comprise at least one second pair of elastically deformable elements. The deformable elements of said at least one second pair can be joined together by the mechanical hinge joining together the deformable elements of the first pair or by a mechanical hinge different from the mechanical hinge joining together the deformable elements of the first pair. Alternatively or combined with the preceding feature, the pairs of deformable elements can be arranged according to a symmetry of rotation about the mechanical hinge. Strictly speaking, the mechanical microsystem according to the first aspect of the invention can further comprise one or more deformable elements not forming part of a pair of deformable elements;

At least one of the deformable elements can be selected from among: a beam and a membrane;

The deformable elements of each pair can have substantially one same geometry;

The mechanical hinge can comprise at least one structuring, in particular by removal(s) of material, of the zone of the mechanical microsystem situated between the deformable elements of each pair. Said at least one structuring preferably gives, to the mechanical hinge, a substantially greater flexibility that that characterising the deformable elements, in particular when the mechanical microsystem comprises a rigid frame to which the deformable elements are securely joined.

Optionally, the manufacturing method according to the second aspect of the invention can further have at least any one of the following features:

The formation of the first and second electroactive layers can comprise the following steps:
  a. one single deposition of a film made of an electroactive material on the front face of the substrate, then
  b. an etching of the deposited film, this etching if necessary implementing an etching mask, so as to draw and separate between them, the first and second electroactive layers.

It is noted, that if the first and second electroactive layers are thus made simultaneously via one single deposition of the film made of an electroactive material, the deposition of said film can in itself comprise a certain number of steps, and therefore be relatively laborious. This illustrates the interest that the invention covers in the state of the art, of which mention is made in the introduction of the application, according to which a double deposition of films made of electroactive material is to be carried out, which is more than the cumbersome doubling relative to the single deposition of the method according to the feature above.

Only the central portion of the substrate can be etched, such that the remaining perimeter of the substrate forms a rigid frame to which the deformable elements are securely joined by their proximal ends, the mechanical hinge joining the deformable elements together by their distal ends, and the mechanical hinge can be flexible, so as to allow a movement of each deformable element outside of the rest plane. The manufacturing method can further comprise a step of structuring the mechanical hinge, in particular by at least one removal of material, of the zone of the substrate and/or of the passive layer situated between the deformable elements. Said at least one structuring is preferably configured such that the mechanical hinge has a flexibility greater than that characterising the deformable elements at least in one given direction;

The manufacturing method can further comprise the deposition of at least one intermediate layer situated between the first electroactive layer and the first deformable element and/or on either side of said first electroactive layer and of the first deformable element, and/or situated between the second electroactive layer and the second deformable element and/or on either side of said second electroactive layer and of the second deformable element. The deposition of said at least one intermediate layer is, if necessary, configured to achieve an electric contact point, in particular for applying and/or measuring an electric current circulation in the electroactive layer with which said at least one intermediate layer is arranged together;

The deposition of the passive layer is configured such that the passive layer has a thickness substantially equal to the depth at which the etching stop layer is embedded in the substrate from its front face. The method thus allows to give substantially one same geometry to the deformable elements of each pair. In this way, one same deformation amplitude of each deformable element of a pair can be expected following the application of one same electric current to each of the electroactive layers arranged together with said deformable elements, or the measuring of one same electric current circulating in each of the electroactive layers can be expected following one same deformation amplitude of said deformable elements.

By a film with the basis of a material A, this means a film comprising this material A and optionally other materials.

It is specified that in the scope of the present invention, the term "electroactive" and its derivatives mean the quality of an element which, in the scope of the present invention, is designed to be used as an element capable of converting in electric signal, into a variation of physical quantity, and/or conversely. This conversion can be achieved by piezoelectricity, by thermal expansion difference, by electrostriction, etc.

It is specified that in the scope of the present invention, the term "passive" and its derivatives designate the quality of an elements makes the basis of a material which is not designed, in the scope of the present invention, to be used as an electroactive element.

By "neutral fibre", this means a line or surface situated inside a deformed part, for example folded or curved, on which no traction stresses, nor compression stresses are exerted. More specifically, during a bending of a beam or of a membrane under the effect of a force, the stiffness of the materials makes a mechanical stress appear on the surface which decreases in the thickness to changing mark on the opposite surface. There is therefore a fictive surface in the material where this stress is zero. This surface is defined as being the neutral fibre of a side of which the materials are compressed, and on the other side of which, the materials are tensioned.

By "beam", this means a deformable element of extended shape, optionally curved, even folded, of which the deformation is used, preferably elastic, as an actuator or as a sensor.

By "membrane", this means a deformable element comprising a flexible wall of which the deformation is used, preferably elastic, as an actuator or as a sensor.

By "mechanical hinge", this means a mechanical articulation region at least between two deformable elements of one same pair.

A preferred embodiment of the second aspect of the invention will first be described in a detailed manner below in reference to FIGS. 2 to 7.

The second aspect of the invention relates to a method for manufacturing a mechanical microsystem 1 according to the first aspect of the invention.

The manufacturing method first comprises a step consisting of providing a substrate 101. The substrate 101 is of a basis of a first material. The first material is a so-called passive material. This is, for example, silicon, and preferably monocrystalline silicon. More specifically, the substrate 101 comprises or is constituted of a silicon wafer.

On the front face 1011 of the substrate 101 provided, at least one first electroactive layer 14 and a second electroactive layer 15 are formed which are spaced apart from one another. The first and second electroactive layers 14 and 15 form a pair. They form, more generally, a first pair of electroactive layers, the substrate 101 such as provided could comprise a plurality of pairs of electroactive layers.

Furthermore, the substrate 101 comprises an embedded etching stop layer 102. Lower, it is seen that the depth at which the etching stop layer 102 is embedded in the substrate 101 can have an impact on the performance of the mechanical microsystem 1 manufactured.

The etching stop layer 102 comprises an opening 3 in the extent of its surface. The opening 3 is more specifically situated just under, or to the right, of (or in line with) at least one portion of the first electroactive layer 14. Preferably, the opening 3 of the etching stop layer 102 does not extend under the second electroactive layer 15. More specifically, the etching stop layer preferably has no opening just under (or in line with) the second electroactive layer 15.

Figure 4:
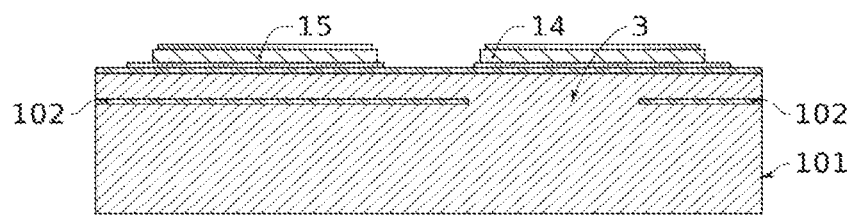
Figure 5:
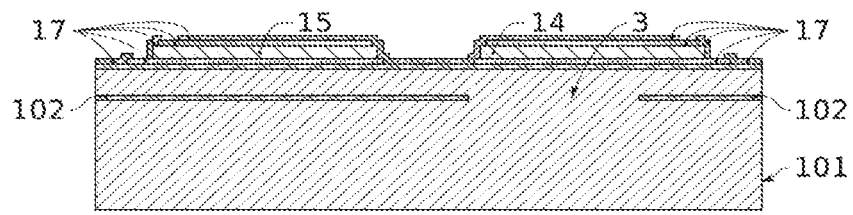

This first step of the method according to the preferred embodiment of the second aspect of the invention therefore consists of providing a stack of layers of micrometric thicknesses such as illustrated in any one of FIGS. 4 and 5.

Figure 2:
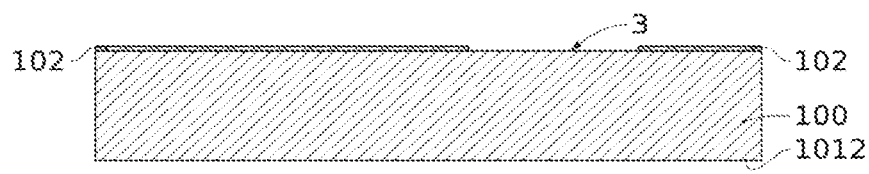
FIGS. 2 to 7 represent schematically different steps of the method for manufacturing the mechanical microsystem such as illustrated in FIG. 1, each of these schematic representations showing a cross-sectional view at different stages of manufacturing the mechanical microsystem.
Figure 3:
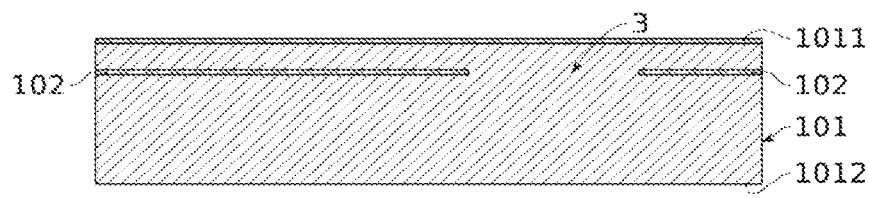

This first step of the method according to the preferred embodiment of the second aspect of the invention can more specifically comprise, as is illustrated in FIGS. 2 to 6, the following sub-steps:

a. providing a silicon wafer 100;
b. generating, for example by direct oxidation of the silicon in a furnace under controlled atmosphere and pressure, a silicon oxide layer on the front face of the wafer, as an etching stop layer 102;
c. making, for example by a chemical etching method, through a mask made by lithography or by reactive ionic etching, an opening in the silicon oxide layer 102 generated, as an opening 3 such as described above. The stack thus obtained is such as illustrated in FIG. 2;
d. depositing, for example by chemical vapour deposition, a silicon layer, potentially amorphous, on the silicon oxide layer 102 and on the opening 3, preferably over the whole extent of the silicon wafer 100. This silicon layer is preferably deposited so as to have a substantially flat front surface. The silicon layer is preferably deposited on the opening 3 before the exposed silicon of the silicon wafer 100 is oxidised;
e. generating, for example by plasma enhanced chemical vapour deposition (PECVD), a silicon oxide layer on the surface of the silicon layer deposited beforehand. The stack thus obtained is such as illustrated in FIG. 3;
f. depositing, on the silicon layer deposited and oxidated on the surface beforehand, at least one film with the basis of an electroactive material intended to constitute each of the electroactive layers 14 and 15 introduced above. Preferably, one single film with an electroactive material is deposited in this step. Thus, the cumbersome work the constituted the deposition of a bilayer with the basis of at least one electroactive material is avoided. This deposition step can also comprise the deposition, for example by physical vapour deposition, of an upper electricity-conducting layer and a lower electricity-conducting layer, for example, platinum-based, situated on either side of the layer with the basis of the electroactive material. Each of these conductive layers is intended to constitute as many electrodes as the mechanical microsystem has electroactive layers;
g. etching at least the layer with the basis of the electroactive material, and if necessary, also etching, the conductive layers, so as to form, on the front face 1011 of the substrate 101, at least the two electroactive layers 14 and 15, if necessary, each being sandwiched between the electrodes formed by etching of the conductive layers. The stack thus obtained is such as illustrated in FIG. 4;
h. depositing and optionally etching certain other layers intended to allow either to insulate, or on the contrary to connect, electrically between them, certain layers or portion of layers, in particular by their edges, and to constitute at least contact points 171. The stack thus obtained is such as illustrated in FIG. 5.

Through the contact points 171, electric current can thus advantageously be either injected into, or collected from, the electroactive layers 14 and 15 via their respective electrodes.

The electrodes, and if necessary, the contact points 171 are here equally considered as intermediate layers 17, of which the preferred embodiment of the method according to the second aspect of the invention provides the deposition. It emerges from the above, that at least one of these intermediate layers 17 can be situated between one or the other from among the first and second electroactive layers 14, 15 and the underlying substrate 101, or at least on at least one from among the first and second electroactive layers, or on either side of the first and second electroactive layers.

Once obtained, a stack of layers of micrometric thicknesses such as illustrated on either of FIGS. 4 and 5, the manufacturing method according to the preferred embodiment of the second aspect of the invention comprises the deposition of a so-called passive layer 103 formed with the basis of a second material. The layer 103 is called passive, as more specifically formed on the basis of a so-called passive material.

The second material with the basis of which the passive layer 103 is formed ca be of the same nature as the first material with the basis of which the substrate 101 is formed. Thus, according to the preferred embodiment of the invention, the passive layer 103 such as deposited is silicon-based, preferably polycrystalline.

The step of depositing the passive layer 103 is more specifically carried out at least just under (or in line with) at least one portion of the first electroactive layer 14, but so as to leave at least one portion of the second electroactive layer 15 uncovered.

Figure 6:
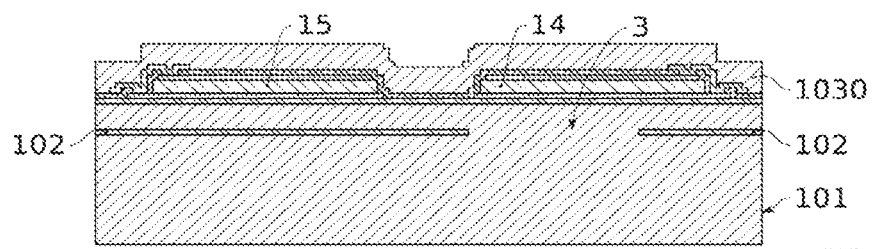
Figure 7:
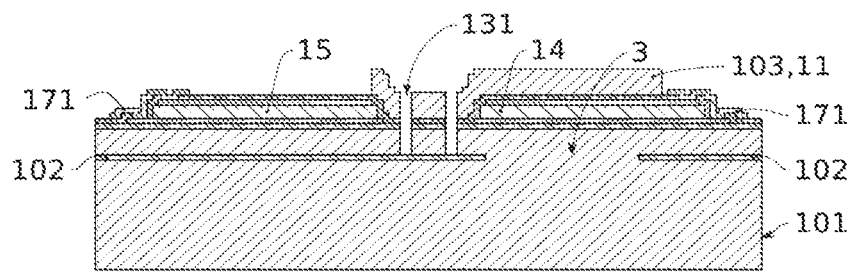

This second step of the method according to the preferred embodiment of the second aspect of the invention can more specifically comprise, as is illustrated in FIGS. 6 and 7, the following sub-steps:

a. depositing a silicon, preferably polycrystalline, layer 1030, preferably conform, on the stack of layers provided in the first step of the method; and
b. etching this layer 1030 at least just under (or in line with) at least one portion of the second electroactive layer 15. Preferably, this etching sub-step further comprises the etching of the conform layer just under (or in line with) the contact points 171. Also preferably, this etching sub-step further comprises the etching of the portion of the conform layer, even of the underlying substrate 101, situated in the middle of the first and second electroactive layers 14 and 15. The etching of the substrate 101 can thus comprise the passing through of the silicon oxide layer generated beforehand on the surface of the silicon layer situated on the etching stop layer 102. This etching sub-step aims to form a first elastically deformable element 11 at least one at least one portion of the first electroactive layer 14, but preferably also has the aim of structuring the zone situated at the centre of the substrate 101, in the middle of the first and second electroactive layers 14 and 15, so as to form a mechanical hinge 13 by structuring the substrate 101. This structuring can in particular be done by means of at least one removal of material 131. This removal of material 131 formed in the manner illustrated in FIG. 7 can consist of a hole or a trench, preferably blind, extending for example from the front face of the mechanical microsystem 1 to the embedded etching stop layer 102.

The mechanical hinge 13 thus formed is of a controlled flexibility. It can more specifically be configured to have a flexibility greater than the flexibility of the first deformable element 11.

It is noted that the deposition of the passive layer 103 is preferably configured such that this layer has a thickness substantially equal to the thickness of the silicon layer deposited beforehand on the silicon oxide layer 102 and on the opening 3. In other words, the deposition of the passive layer 103 is preferably configured such that this layer has a thickness substantially equal to the depth at which the etching stop layer 102 is embedded in the substrate 101 from its front face 1011.

The manufacturing method then comprises a step consisting of etching at least partially the substrate 101 from its rear face 1012. More specifically, at least one central portion 13 of the substrate 100 is etched during this step. This etching step is configured so as to remove the central portion 1013 of the substrate 100 over the whole of its thickness situated just under (or in line with) the etching stop layer 102. It is further configured so as to be continued by the removal of the central portion 1013 of the substrate 101 over the whole of its thickness to the right of the opening 3 that the etching stop layer 102 has. More specifically, the continuation of the etching to the right of the opening 3 is advantageously stopped by the silicon oxide layer generated on the surface of the passive layer 103.

Thus, a mechanical microsystem 1 such as illustrated as an example in FIG. 1 is obtained. More specifically, such as illustrated in FIG. 1, the step of etching the substrate 100 by its rear face 1012 allows to form a second elastically deformable element 12, arranged together with the second electroactive layer 15.

It must be noted that, alternatively or complementarily, the structuring of the mechanical hinge 13 such as described above, the step of etching the substrate 101 by its rear face 1012 can be configured so as to contribute to the structuring of the mechanical hinge 13.

It appears, in FIG. 1, that the mechanical hinge 13 formed in the way described above allows to join together the deformable elements 11 and 12.

Preferably, only the central portion of the substrate 101 is etched from the rear face 1012 of the substrate 101. Thus, such as illustrated in FIG. 1, the inner perimeter of the substrate 101 is not etched and is conserved so as to constitute a rigid frame 16 to which the deformable elements 11, 12 are securely joined. The deformable elements 11, 12 are more specifically joined to the frame 16 by their proximal ends 113, 123, while the mechanical hinge 13 joins together the deformable elements 11, 12 by their distal ends 114, 124. It is therefore understood that, in this preferred embodiment, it is advantageous that the mechanical hinge 13 is flexible, so as to allow a movement of each deformable element 11, 12 outside of the rest plane, wherein each deformable element 11, 12 falls into, as follows, the implementation of the manufacturing method according to the second aspect of the present invention. Indeed, the proximal ends 113, 123 of the deformable elements 11, 12 being joined to the rigid frame 16 are not led to be deformed significantly with respect to the deformation that each of the distal ends 114, 124 of the deformable elements 11, 12 can undergo, insofar as these are joined to the mechanical hinge 13 which is relatively more flexible than the rigid frame 16, even relatively more flexible than the deformable elements 11, 12 themselves.

In reference to FIG. 8, each of the deformable elements 11 and 12 having antagonistic movements, due to the arrangement detailed below of the electroactive layers 14, 15 regarding the deformable elements 11, 12, the antagonistic movements, outside of their rest plane, of the deformable elements 11, 12 induce, by construction, a rotation of the mechanical hinge 13 around a centre of rotation falling substantially in the rest plane. The mechanical hinge 13 thus constitutes a zone potentially subjected to a rotation about an axis falling into the rest plane, this rotation could vary around a balance position which remains substantially in the rest plane. Even then, with respect to the state of the art, the action of arranging a rotation capacity of the mechanical hinge 13 which oscillates with respect to a balance position situated in the rest plane, allows to obtain rotations at one-half the tension, which has a certain interest.

The abovementioned different steps and sub-steps of deposition and etching are advantageously implemented by standard microelectronic techniques, such as physical or chemical vapour depositions, reactive ionic etchings or chemical etchings. These techniques can optionally require implementing etching masks and/or comprise passivation deposition steps.

It also appears, that from the consequences of the manufacturing method according to its preferred embodiment above, the deformable elements 11, 12 constitute beams made of one same passive material, namely silicon, preferably polycrystalline, and having substantially the same thickness, even the same geometry.

In this way, one same amplitude of deformation of each deformable element 11, 12 of a pair can be expected, following the application of one same electric current to each of the electroactive layers 14, 15 arranged together with said deformable elements 11, 12, or the measuring of one same electric current circulating in each of the electroactive layers 14, 15 can be expected following one same amplitude of deformation of said deformable elements 11, 12.

Furthermore, it appears that the mechanical hinge 13 is at least partially constituted on the basis of the same material as the deformable elements 11, 12, the mechanical hinge 13 being indeed obtained by structuring the silicon-based substrate 101.

In reference to FIG. 1, the mechanical microsystem 1 according to the first aspect of the invention therefore mainly comprises:

a. a pair of elastically deformable elements 11, 12, b. a mechanical hinge 13 joining the deformable elements 11, 12 together, and c. at least two electroactive layers 14, 15, the mechanical microsystem 1 being configured such that, from a rest position wherein the deformable elements 11, 12 fall substantially into the abovementioned rest plane, a deformation of the deformable elements 11, 12 displacing them at least partially outside of the rest plane induces an electric current circulation in the electroactive layers 14, 15, and/or conversely.

It will be noted that, by construction, each deformable element 11, 12 has a front face 111, 121 and a rear face 112, 122 opposite one another and substantially parallel to the rest plane.

The mechanical microsystem 1 is distinguished from the mechanical microsystems known from the prior art at least in that the first electroactive layer 14 is arranged together with the first deformable element 11 of the pair on a rear face 112 of this first deformable element 11, and in that the second electroactive layer 15 is arranged with the second deformable element 12 of the pair on a front face 121 of this second deformable element 12.

Figure 8:
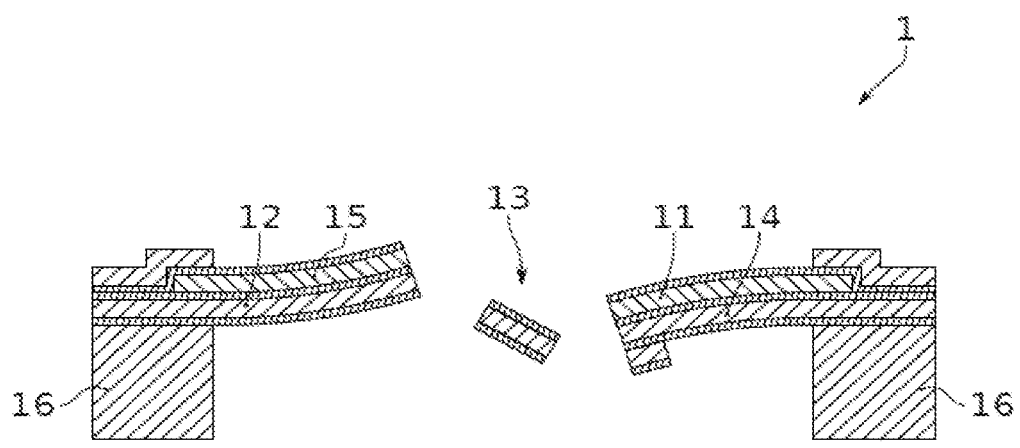
FIG. 8 represents schematically a cross-sectional view of the mechanical microsystem according to an embodiment of the first aspect of the invention in its out-of-rest state.

The invention according to its first aspect thus proposes a mechanical microsystem 1 capable of generating movements of the deformable elements 11, 12 of each pair, outside of the rest plane, which are antagonistic to achieve a bimetal effect, as is represented in FIG. 8. Indeed, each of the deformable elements of one same pair can:

a. either be displaced in a direction opposite to the other deformable element of the pair to induce the electric current circulation in the electroactive layer that it supports, the mechanical microsystem thus acting as a sensor, b. or be supplied by an electric current to induce its displacement outside of the rest plane in a direction opposite to the displacement outside of the rest plane of the other deformable element of the pair, the mechanical microsystem thus acting as an actuator.

Thanks to these antagonistic movements of the deformable elements 11, 12 of each pair, it is allowed to generate an angle between two deformable elements of one same pair, along an axis in the rest plane, doubled, with respect to a mechanical microsystem with non-antagonistic movements, for one same electric current circulating in the electroactive layers. Regarding this advantage, it is allowed, thanks to the antagonistic movements of the deformable elements, to obtain displacements of the deformable elements 11, 12 of one same pair, of an amplitude substantially equal to that offered by a mechanical microsystem with non-countering movements, but for one-half of the electric current, this advantage conveying electric energy savings having a certain interest.

Furthermore, the neutral fibre of the mechanical microsystem 1 according to the first aspect of the invention advantageously passes between each deformable element 11, 12 and the electroactive layer 14, 15 arranged together with this deformable element. This position of the neutral fibre is a direct consequence of the manufacturing method 1, in particular when this does not comprise any deposition of intermediate layers 17. When the method comprises depositions of such intermediate layers 17, these are configured so as to not significantly impact on the position of the neutral fibre, such that the latter continues to pass between each deformable element 11, 12 and the electroactive layer 14, 15 which allows to deform it, and therefore such that the desired bimetal effect is achieved.

These properties and advantages of the mechanical microsystem 1 according to the first aspect of the invention are particularly useful when it is desired to produce MOEMS (Micro-Opto-Electro-Mechanical Systems) mirrors, in particular to route optical telecommunications or scanners for LIDAR devices.

Further to its application to MOEMS mirrors, the present invention is also applied for inkjet printing, for capturing and measuring a pressure, etc.

As illustrated in FIG. 1, the deformable elements 11, 12 are situated opposite one another relatively to the mechanical hinge 13. The latter can moreover be used to join together deformable elements (not represented) of another pair. This other pair can, for example, be identical to the pair of deformable elements 11, 12, but by being rotated by 90° around the mechanical hinge 13 with respect to the pair of deformable elements 11, 12. In other words, the same illustration of the mechanical microsystem 1 than that of FIG. 1 could be obtained by considering a cross-sectional plane substantially centred on the mechanical hinge 13 and perpendicular to the cross-sectional plane that FIG. 1 illustrates.

It must further be noted, that if the beams 11, 12 appear as streamlined elements in FIG. 1, these elements can adopt any substantially extended geometric shape. They can, for example, be curved, even folded, in the rest plane. More specifically, each beam can be any substantially extended shape, and in particular the shapes that the beams that are illustrated and described in the article by J. Tsaur, et al. are, referenced in the introduction.

The mechanical microsystem 1 according to the preferred embodiment of the first aspect of the invention comprises more specifically PTZ-based electroactive layers. The mechanical microsystem 1 with these electroactive layers 14, 15 is particularly interesting, since this type of electroactive layer can only be contracted under the effect of an electric field, and cannot therefore allow to deform the deformable element 11, 12 which supports it in more than one direction. It is therefore here only the particular arrangement of each pair of electroactive layers with each pair of deformable elements which allows the mechanical microsystem 1 of the antagonistic movements of its deformable elements. Moreover, PTZ advantageously has a high piezoelectric conversion rate.

The invention is not limited to the embodiments described above and extends to all the embodiments covered by the claims.

For example, each deformable element, each pair of deformable elements, even a set of deformable elements, can comprise, or constitute, or be arranged together with, a flexible membrane.

The invention claimed is:

1. A mechanical microsystem, comprising:
a pair of elastically deformable elements,
a mechanical hinge joining the deformable elements together, and
at least two electroactive layers,
wherein the mechanical microsystem is configured such that, from a rest position in which the deformable elements are substantially parallel to one same rest plane, (1) a deformation of at least a first deformable element of the deformable elements displacing the at least the first deformable element at least partially outside of the rest plane induces a first electric current in at least one of the at least two electroactive layers, and/or (2) a second electric current in at least one of the at least two electroactive layers induces a deformation of at least a second deformable element of the deformation elements, displacing the at least the second deformable element at least partially outside of the rest plane, each deformable element has a front face and a rear face opposite one another and substantially parallel to the rest plane, and, for each deformable element, a direction from the front face to the rear face is identical, a first of the at least two electroactive layers is arranged together with a first deformable element of the pair of elastically deformable elements on a rear face of said first deformable element, and a second electroactive layer, different from the first electroactive layer, of the at least two electroactive layers, is arranged with a second deformable element of the pair of elastically deformable elements, different from the first element, on a front face of said second deformable element.

2. The mechanical microsystem according to claim 1, further comprising a rigid frame, wherein the pair of elastically deformable elements are securely joined by proximal ends, the mechanical hinge joining the pair of elastically deformable elements together by corresponding distal ends, and the mechanical hinge is flexible so as to allow a movement of the pair of elastically deformable elements outside of the rest plane.

3. The mechanical microsystem according to claim 1, wherein at least one electroactive layer of the at least two electroactive layers includes an electroactive material being one of a piezoelectric material, a ferromagnetic material and a PTZ-based electroactive material.

4. The mechanical microsystem according to claim 1, wherein the pair of elastically deformable elements and the mechanical hinge include a same material.

5. The mechanical microsystem according to claim 1, further comprising at least one intermediate layer situated between the first electroactive layer and the first deformable element and/or on either side of said first electroactive layer and of the first deformable element, and/or situated between the second electroactive layer and the second deformable element and/or on either side of said second electroactive layer and of the second deformable element.

6. The mechanical microsystem according to claim 5, wherein said at least one intermediate layer is configured to achieve an electric contact point.

7. The mechanical microsystem according to claim 5, wherein said at least one intermediate layer is arranged such that a neutral fiber of the mechanical microsystem is situated between each electroactive layer, and the deformable element arranged with said electroactive layer.

8. The mechanical microsystem according to claim 1, further comprising at least one second pair of elastically deformable elements, the deformable elements of said at least one second pair being joined together by the mechanical hinge joining together the deformable elements of the first pair or by a mechanical hinge different from the mechanical hinge joining together the deformable elements of the first pair.

* * * * *